United States Patent [19]
Liu

[11] Patent Number: 5,731,966
[45] Date of Patent: Mar. 24, 1998

[54] SNUBBER CIRCUIT FOR RECTIFYING DIODES AND METHOD OF OPERATION THEREOF

[75] Inventor: Rui Liu, Plano, Tex.

[73] Assignee: Lucent Technologies Inc., Murray Hill, N.J.

[21] Appl. No.: 664,754

[22] Filed: Jun. 17, 1996

[51] Int. Cl.$^6$ ............................................. H02H 7/125
[52] U.S. Cl. ............................................. 363/53; 363/17
[58] Field of Search ............................. 363/56, 17, 53

[56] References Cited

U.S. PATENT DOCUMENTS

| | | | |
|---|---|---|---|
| 4,370,701 | 1/1983 | Western | 363/20 |
| 4,392,172 | 7/1983 | Foley et al. | 361/8 |
| 4,493,017 | 1/1985 | Kammiller et al. | 363/98 |
| 4,616,741 | 10/1986 | Ekstrand | 323/297 |
| 4,811,187 | 3/1989 | Nakajima et al. | 363/25 |
| 4,977,493 | 12/1990 | Smith | 363/126 |
| 5,093,597 | 3/1992 | Hughes | 310/209 |
| 5,130,917 | 7/1992 | Shekhawat | 363/56 |
| 5,231,563 | 7/1993 | Jitaru | 363/98 |
| 5,258,902 | 11/1993 | Lindbery et al. | 363/56 |
| 5,260,607 | 11/1993 | Kinbara | 307/253 |
| 5,278,748 | 1/1994 | Kitajima | 363/56 |
| 5,351,179 | 9/1994 | Tsai et al. | 363/53 |
| 5,379,206 | 1/1995 | Davidson | 363/55 |
| 5,416,361 | 5/1995 | John et al. | 327/310 |
| 5,438,498 | 8/1995 | Ingemi | 363/17 |
| 5,448,467 | 9/1995 | Ferreira | 363/17 |
| 5,539,630 | 7/1996 | Pietkiewicz et al. | 363/17 |
| 5,550,458 | 8/1996 | Farrington et al. | 323/282 |
| 5,619,401 | 4/1997 | Karlsson et al. | 363/17 |

*Primary Examiner*—Peter S. Wong
*Assistant Examiner*—Derek J. Jardieu

[57] ABSTRACT

For use in a power supply having a rectifying diode, a snubber circuit for, and method of moderating a reverse recovery current that flows from the rectifying diode as the rectifying diode transitions from a conducting state to a non-conducting state. The snubber circuit includes: (1) a saturable reactor, coupled in electrical series with the rectifying diode and providing a first conductive path for a first portion of the reverse recovery current from the rectifying diode and (2) a saturable reactor resetting circuit, coupled in electrical parallel with the saturable reactor and providing a second conductive path for a second portion of the reverse recovery current from the rectifying diode, the second conductive path reducing the reverse recovery current through the saturable reactor, thereby decreasing a thermal dissipation of the saturable reactor as the rectifying diode transitions from the conducting state to the non-conducting state.

20 Claims, 4 Drawing Sheets

SNUBBER CIRCUIT FOR RECTIFYING DIODES AND METHOD OF OPERATION THEREOF

TECHNICAL FIELD OF THE INVENTION

The present invention is directed, in general, to power supplies and, more specifically, to a snubber circuit for rectifying diodes and a method of operation thereof.

BACKGROUND OF THE INVENTION

A power converter is a power processing circuit that converts an input voltage waveform into a specified output voltage waveform. In many applications requiring a DC output, switched-mode DC/DC converters are frequently employed to advantage. DC/DC converters generally include an inverter, an input/output isolation transformer and a rectifier on a secondary side of the isolation transformer. The inverter generally includes a switching device, such as a field effect transistor ("FET"), that converts the DC input voltage to an AC voltage. The input/output isolation transformer, then, transforms the AC voltage to another value and the rectifier generates the desired DC voltage at the output of the power converter. Conventionally, the rectifier comprises a plurality of rectifying diodes that conduct the load current only when forward-biased in response to the input waveform to the rectifier.

When the input voltage is, for instance, stepped down across a step-down isolation transformer in the power converter, the current capacity required on the secondary side of the transformer and the rectifier is significantly higher than that on the primary side of the transformer. As a result, the power converter suffers efficiency losses on the secondary side of the isolation transformer that impair the overall performance of the power converter. The path between the isolation transformer and the rectifier is of acute interest because it carries high AC that is subject to onerous losses. Additionally, the path between the isolation transformer and the rectifier realizes stray inductances that also impair the efficiency of the power converter. Moreover, the rectifying diodes, constituting the rectifier of the power converter, suffer from a reverse recovery condition thereby producing excessive power loss in the rectifying diodes and oscillations in both current and voltage therefrom. Therefore, efforts to minimize the losses associated with the rectifier and, more specifically, with the rectifying diodes will improve the overall performance of the power converter.

A traditional manner to reduce the losses associated with the rectifying diodes is to introduce a snubber circuit coupled to the rectifying diodes. Snubber circuits are generally employed for various functions including to minimize overcurrents and overvoltages across a device during conduction and non-conduction periods and to shape the device switching waveforms such that the voltage and current associated with the device are not concurrently high. For instance, with respect to rectifying diodes, a snubber circuit may be employed to minimize oscillations in both voltage and current and power losses associated therewith due to reverse recovery current resulting from a snap-off of the rectifying diode during a transition from a conduction to non-conduction mode of operation.

Snubber circuits are well known in the prior art. For instance, a resistor-capacitor ("RC") snubber circuit employs a resistor in series with a capacitor across the rectifying diodes. The RC snubber provides both turn-off snubbing and damping of voltage oscillations across the rectifying diodes, but it incurs a relatively high power loss. A second alternative approach is to place a diode in series with a resistor and capacitor in a resistor-capacitor-diode ("RCD") snubber circuit. The diode, when forwardly biased, provides a mechanism to charge the snubber capacitor therethrough in preparation for a subsequent conduction cycle of the rectifying diodes. With respect to the RC snubber circuit or the RCD snubber circuit the following principles apply. First, the capacitor is usually larger than the junction capacitance of the rectifying diode so that the rising of the diode voltage is relatively slow thereby reducing the voltage overshoot. Second, the resistor provides damping to reduce voltage oscillations across the rectifying diode, but the resistor also dissipates energy. Finally, selection of the capacitor and resistor includes tradeoffs. More specifically, a larger capacitor reduces the transients, but increases the power dissipation associated therewith. In other words, an optimal design is difficult to achieve for either the RC or RCD snubber circuit.

An alternative approach is to employ a saturable reactor snubber circuit in series with the rectifying diode. The saturable reactor normally has an amorphous core that has the capability of being able to transition between low impedance (i.e., saturation) and high impedance with relatively low core losses. Therefore, when the rectifying diode is conducting the reactor (in saturation) provides low impedance thereby allowing the current to flow freely. However, when the rectifying diode transitions from conduction to non-conduction and the reverse recovery condition occurs, the reactor provides a high impedance thereby reducing the reverse current flow. The saturable reactor has to be cooled by forced air, otherwise the reactor will run too hot. When applied to natural convection cooling power supplies, the temperature rise (e.g., up to 120° Celsius) is not acceptable.

Accordingly, what is needed in the art is a snubber circuit for rectifying diodes that minimizes the reverse recovery condition to thereby reduce the power losses associated with the rectifying diode and oscillations in both voltage and current therefrom and reduces the thermal effects of the snubber circuit on the rectifying diode employing the snubber circuit to advantage.

SUMMARY OF THE INVENTION

To address the above-discussed deficiencies of the prior art, the present invention provides, for use in a power supply having a rectifying diode, a snubber circuit for, and method of moderating a reverse recovery current that flows from the rectifying diode as the rectifying diode transitions from a conducting state to a non-conducting state.

The snubber circuit includes: (1) a saturable reactor, coupled in electrical series with the rectifying diode and providing a first conductive path for a first portion of the reverse recovery current from the rectifying diode and (2) a saturable reactor resetting circuit, coupled in electrical parallel with the saturable reactor and providing a second conductive path for a second portion of the reverse recovery current from the rectifying diode, the second conductive path reducing the reverse recovery current through the saturable reactor, thereby decreasing a thermal dissipation of the saturable reactor as the rectifying diode transitions from the conducting state to the non-conducting state.

The present invention maintains the advantages of a saturable reactor snubber circuit (i.e., reduce the peak reverse recovery current of the rectifying diodes), while reducing the temperature rise of the saturable reactor to an acceptable level. The snubber circuit can operate efficiently in a natural convection cooling environment. The snubber circuit attains its intended objective through bypassing a portion of the reverse recovery current of the rectifier diode around the saturable reactor to thereby reduce the core temperature rise therein.

For the purposes of the present invention, the following terms are defined as follows. The conduction state of the rectifier diode refers to a condition whereby a current therethrough is sufficient to drive the saturable reactor, coupled to the rectifier diode, into saturation. The non-conduction state of the rectifier diode refers to a condition whereby the rectifier diode exhibits a reverse recovery current of which the magnitude is less than the forward conduction current of the rectifier diode and is, further, insufficient to induce the core of the saturable reactor to saturate.

In an alternative embodiment of the present invention, the saturable reactor resetting circuit comprises a zener diode, having a reverse breakdown or knee voltage, for conducting the second portion of the reverse recovery current from the rectifying diode, a magnitude of the second portion being a function of the reverse breakdown voltage. Those of ordinary skill in the pertinent art should understand the advantage of employing zener diodes in the present invention. In a representative embodiment, the knee voltage of the zener diode is selected at about a half of the peak voltage induced across the saturable reactor by the reverse recovery current of the rectifier diode. The zener diode, therefore, conducts a portion of the reverse recovery current of the rectifying diode to thereby decrease the thermal dissipation of saturable reactor resulting from the flow of reverse recovery current therethrough.

In an alternative embodiment of the present invention, the saturable reactor resetting circuit comprises a blocking diode for biasing the second conductive path as against a flow of forward current therealong. When the rectifying diode is conducting, it is preferable that the second conductive path be biased against the flow of forward current. The blocking diode obstructs the second conductive path such that the forward current conducts through the first conductive path including the saturable reactor and the rectifying diode. One of ordinary skill in the pertinent art should understand that other blocking elements are well within the scope of the present invention.

In an alternative embodiment of the present invention, the saturable reactor is operable in a saturated state when the rectifying diode is in the conducting state, the saturable reactor presenting essentially no impedance to current flow in the saturated state. A characteristic of saturable reactors is that the reactor acts as a short circuit thereby providing no impedance when in saturation. Therefore, employing the saturable reactor in the snubber circuit allows the rectifying diode to conduct forward current during its conduction period with no impedance through the snubber circuit.

In an alternative embodiment of the present invention, the saturable reactor is operable in a non-saturated state when the rectifying diode is in the non-conducting state, the saturable reactor presenting a finite impedance to the reverse recovery current. A characteristic of saturable reactors is that the reactor provides a finite impedance when non-saturated. Therefore, employing the saturable reactor in the snubber circuit provides an impedance to the flow of the reverse recovery current of the rectifying diode when the rectifying diode is not conducting.

In an alternative embodiment of the present invention, the saturable reactor resetting circuit comprises a passive component for providing the second conductive path for the second portion of the reverse recovery current from the rectifying diode. A resistive passive element may be employed to advantage in the saturable reactor resetting circuit. One of ordinary skill in the pertinent art should understand that other passive components or even active components capable of providing the second conductive path for the second portion of the reverse recovery current from the rectifying diode are well within the scope of the present invention.

In an alternative embodiment of the present invention, the snubber circuit is employed in a power converter, a transformer forming a portion of the power converter and having first and second secondary winding taps, the snubber circuit coupled to the first secondary winding tap, a second snubber circuit coupled to the second secondary winding tap. The present invention provides an alternative to handle the reverse recovery current of rectifying diodes employed in power converters or other power supplies. The saturable reactor is well suited to be incorporated into the snubber circuit because of the characteristics thereof. Moreover, the reactor resetting circuit provides the mechanism to reset the saturable core thereby reducing the heat generated by the saturable reactor to facilitate a commercially viable snubber circuit for a power supply incorporating rectifying diodes to advantage. While a transformer is introduced into the present power converter, one of ordinary skill in the pertinent art should understand that the present invention is equally applicable to other power supply topologies (including transformerless power converters) employing rectifying diodes therein.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
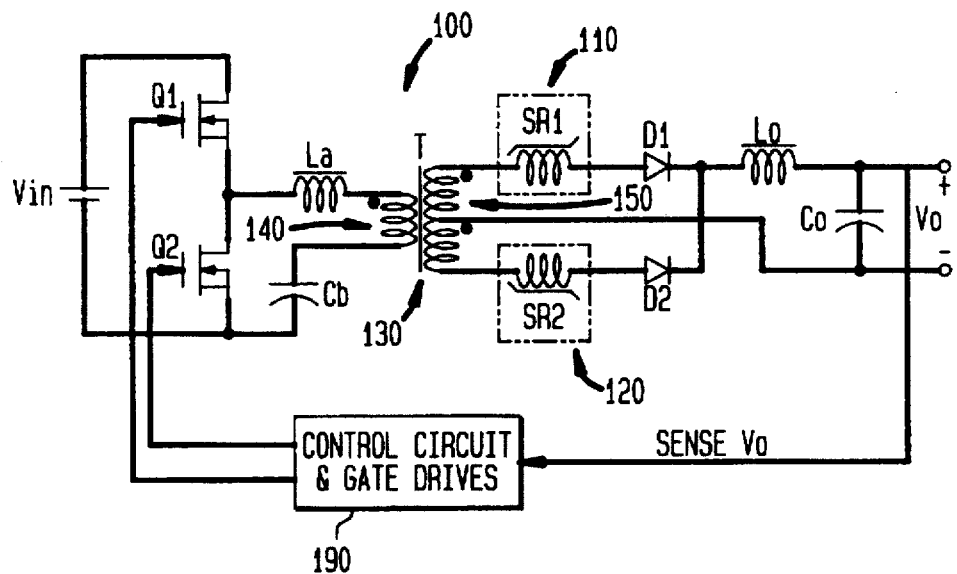
FIG. 1 illustrates a schematic diagram of a power converter employing prior art snubber circuits.

Referring initially to FIG. 1, illustrated is a schematic diagram of a power converter 100 employing prior art snubber circuits (a first snubber circuit 110 and a second snubber circuit 120). The power converter 100 includes a power switch field effect transistors ("FETs") Q1, Q2 connected to and periodically switched to apply an input voltage $V_{in}$ to a primary winding 140 of a power transformer 130. A secondary winding 150 of the power transformer 130 is connected to a rectifier comprising first and second rectifier diodes D1, D2. The rectifier diodes D1, D2 rectify the periodic waveform supplied to the rectifier by the secondary winding 150. A low-pass filter comprising an inductor $L_o$ and a capacitor $C_o$ act on the rectified waveform to supply a DC output voltage $V_o$. A control and drive circuit 190 senses the output voltage $V_o$ and produces a pulse train of the proper duty ratio to drive the power switch FETs Q1, Q2.

The first and second snubber circuit 110, 120 comprise a first and second saturable reactor SR1, SR2, respectively, to reduce a reverse recovery current of the first and second rectifying diode D1, D2 associated therewith. For reasons that will become more apparent (see description with respect to FIG. 2), a saturable reactor snubber circuit endures a high temperature rise thereby requiring forced-air cooling (or the like) for the saturable reactor or limiting the use of the saturable reactor snubber circuit to applications where heat dissipation is not an issue.

Figure 2:
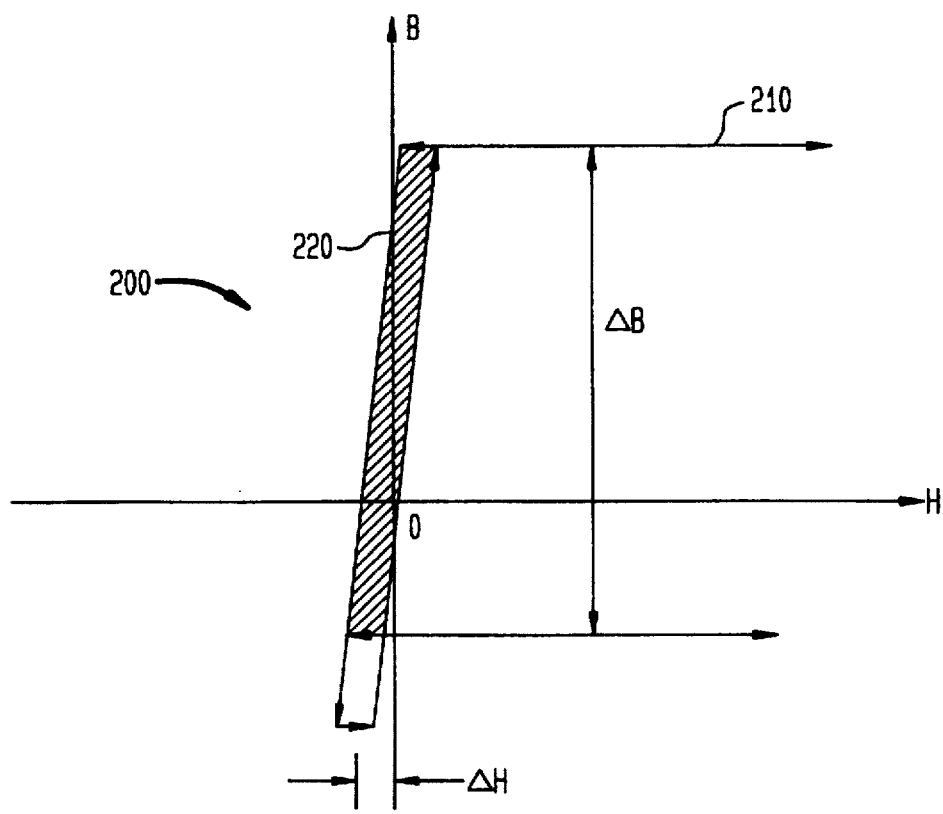
FIG. 2 illustrates a curve of magnetic flux density versus magnetic field strength for the saturable reactors of FIG. 1.

Turning now to FIG. 2, illustrated is a curve 200 of magnetic flux density ("B") versus magnetic field strength ("H") for the saturable reactors SR1, SR2 of FIG. 1. While the following discussion is directed to the first saturable reactor SR1, the principles are equally applicable to the second saturable reactor SR2 or any conventional saturable reactor.

A saturable reactor, generally, constitutes a beneficial snubber circuit because of the electrical characteristics thereof. More specifically, a saturable reactor provides no impedance to the forward flow of current when the saturable core is saturated denoted by curve portion 210). Conversely, when a saturable core ms not saturated (denoted by curve portion 220), the saturable reactor provides a finite impedance to the forward flow of current therethrough. The curve portion 220 also corresponds to a change of the flux density ("ΔB") and magnetic strength ("ΔH") of the saturable core. The resulting area relating to the change in magnetic flux density and magnetic field strength is proportional to the energy dissipated by the saturable core in the form of heat generation or the like.

With continuing reference to FIG. 1, when the rectifying diode D1 is conducting, the saturable reactor SR1 is saturated (illustrated by curve portion 210) and provides no impedance to the forward flow of current. When the rectifying diode D1 transitions from a conduction to non-conduction mode of operation, a reverse recovery current results and thereby conducts through the saturable reactor SR1. At this point, the saturable reactor SR1 transitions to a non-saturated state (illustrated by curve portion 220) exhibiting an impedance to thereby reduce the reverse recovery current. The further that the saturable reactor SR1 moves away from saturation, the greater the energy dissipated by the core. The energy dissipated (i.e., the heat dissipated) in the process of reducing the reverse recovery current of the rectifying diode D1 must be dealt with (e.g., remove by forced-air cooling) due to the adverse effects on the rectifying diode and power supply employing a saturable reactor snubber circuit to advantage. Obviously, this shortcoming in the operation of the saturable reactor limits its application in power supplies.

Figure 3:
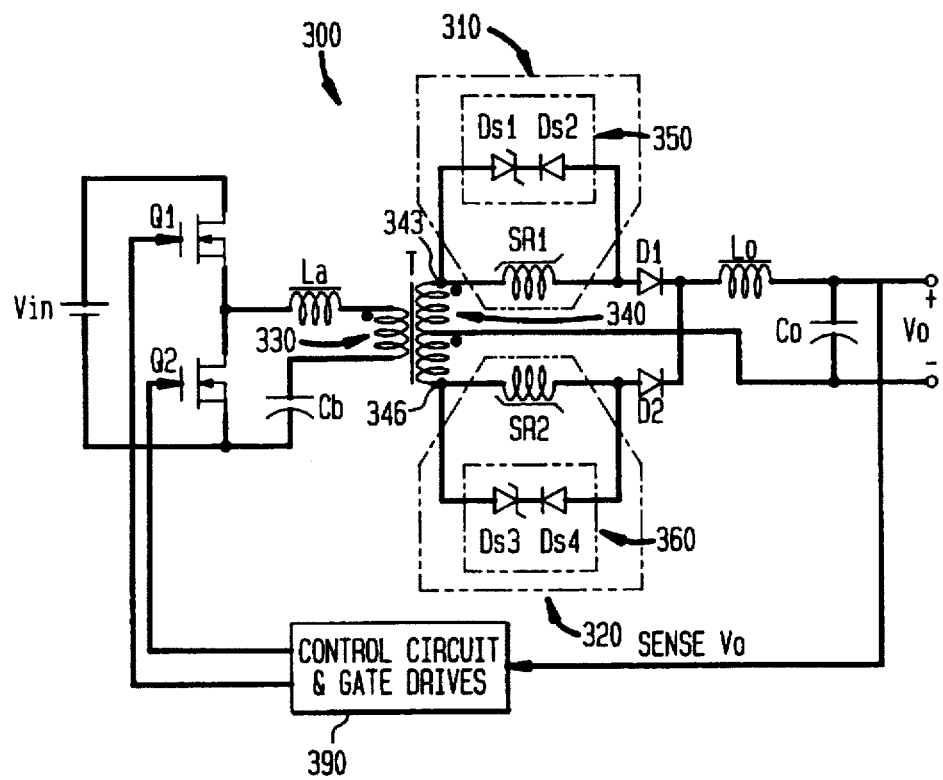
FIG. 3 illustrates a schematic diagram of a representative power converter employing an embodiment of snubber circuits constructed according to the principles of the present invention.

Turning now to FIG. 3, illustrated is a schematic diagram of a representative power converter 300 employing an embodiment of snubber circuits (a first snubber circuit 310 and a second snubber circuit 320) constructed according to the principles of the present invention. The power converter 300 includes a power train comprising power switch field effect transistors ("FETs") Q1, Q2 connected to and periodically switched to apply an input voltage $V_{in}$ to a primary winding 330 of a power transformer T. A secondary winding 340 of the power transformer T is connected to a rectifier comprising first and second rectifier diodes D1, D2. The rectifier diodes D1, D2 rectify the periodic waveform supplied to the rectifier by the secondary winding 340. A low-pass filter comprising an inductor $L_o$ and a capacitor $C_o$ act on the rectified waveform to supply a DC output voltage $V_o$. A control and drive circuit 390 senses the output voltage $V_o$ and produces a pulse train of the proper duty ratio to drive the power train. While the snubber circuit of the present invention will hereinafter be described with respect to the power converter 300 (i.e., asymmetrical half-bridge power converter), the principles of the present invention are equally applicable to other power supply topologies (e.g., a boost power converter) employing rectifying diodes to advantage.

The first snubber circuit 310 (coupled to the secondary winding 340 via a first secondary winding tap 343) comprises a first saturable reactor SR1 in parallel with a first saturable reactor resetting circuit or first resetting circuit 350; the second snubber circuit 320 coupled to the secondary winding 340 via a second secondary winding tap 346) comprises a second saturable reactor SR2 in parallel with a second saturable reactor resetting circuit or second resetting circuit 360. The snubber circuits 310, 320 reduce a reverse recovery current of the first and second rectifying diodes D1, D2, associated therewith. For reasons discussed with respect to FIGS. 1 and 2, the prior art saturable reactor snubber circuits endure a high temperature rise thereby limiting the use of the saturable reactor as a viable snubber circuit. The present invention incorporates the resetting circuits 350, 360 into the snubber circuits 310, 320 to reduce the temperature rise of the saturable reactors SR1, SR2, respectively, to an acceptable level. In the illustrated embodiment, the first resetting circuit 350 comprises a zener diode Ds1 and a blocking diode Ds2; the second resetting circuit 360 comprises a zener diode Ds3 and a blocking diode Ds4. While the illustrated embodiment discloses zener and blocking diodes in the resetting circuits 350, 360, other active components or, even, passive components (e.g., a resistor) capable of resetting the core of the saturable reactor to limit the temperature rise therein are well within the broad scope of the present invention. The operation of the snubber circuits 310, 320 will hereinafter be described in greater detail.

Figure 4:
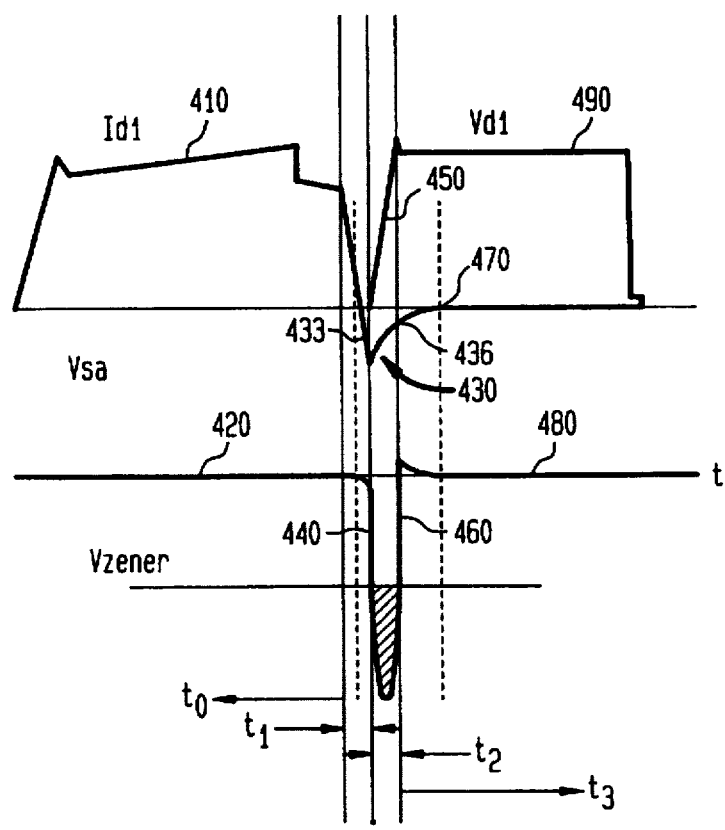
FIG. 4 illustrates voltage and current characteristics of the operation of the first rectifying diode and first snubber circuit of FIG. 3.

Turning now to FIG. 4, illustrated are voltage and current characteristics of the operation of the first rectifying diode D1 and first snubber circuit 310 of FIG. 3. While the following discussion is directed to the first rectifying diode D1 and first snubber circuit 310, the principles are equally applicable to the second rectifying diode D2 and second snubber circuit 320 or any conventional rectifying diode and snubber circuit in accordance with the principles of the present invention. With reference to FIG. 3, the illustrated embodiment demonstrates current characteristics $I_{d1}$ (including the reverse recovery current 430) and voltage characteristics $V_{d1}$ of the rectifying diode D1. Furthermore, voltage characteristics $V_{sa}$ of the first saturable reactor SR1 and knee voltage $V_{zener}$ of the zener diode Ds1 are illustrated. The foregoing plots will now be described over a period of time corresponding to the operation of the rectifying diode D1.

During a time $t_0$, the rectifying diode D1 is conducting current in a forward direction (as denoted by the positive rising portion 410 of current characteristic curve $I_{d1}$). At this time, the saturable reactor SR1 is saturated (exhibiting no voltage as reflected by the zero region portion 420 of the voltage characteristic curve $V_{sa}$) thereby providing no impedance to the forward direction of current through the rectifying diode D1. One of the advantages of employing the saturable reactor SR1 in the snubber circuit 310 is that during the conduction period of the rectifying diode D1, the saturable reactor SR1 provides no impedance to the flow of current therethrough.

Turning now to time period $t_1$, the rectifying diode transitions from a conduction to non-conduction mode of operation. As a result of the transition, the current through the rectifying diode D1 begins to fall and exhibits a reverse recovery condition (generally, at a first portion 433 of the reverse recovery current 430 of current characteristic curve $I_{d1}$). The first portion 433 of the reverse recovery current 430 flows though the saturable reactor SR1 (opposite in direction to the forward flow of current in period $t_0$) via a first conductive path (see reference to a first conductive path 610 in FIG. 6). An additional advantage of employing the saturable reactor SR1 in the snubber circuit 310 is that during the non-conduction period of the rectifying diode D1, the core of the saturable reactor SR1 becomes non-saturated thereby providing a finite impedance to the flow of current therethrough. Consequently, a voltage is induced across the saturable reactor $V_{sa}$ (as denoted by curve portion 440 of voltage characteristic curve $V_{sa}$). While the saturable reactor SR1 is reducing the reverse recovery current 430, it is also dissipating thermal energy proportional to the current flowing therethrough.

Turning now to a time $t_2$, the rectifying diode D1 is still exhibiting a reverse recovery condition (generally, at a second portion 436 of the reverse recovery current 430 of current characteristic curve $I_{d1}$). However, the voltage across the snubber circuit 310 reaches the knee voltage of the zener diode Ds1 (denoted by voltage characteristic curve $V_{zener}$) thereby creating a second conductive path (see reference to a second conductive path 710 in FIG. 7) for the second portion of the reverse recovery current 430. The second portion of the reverse recovery current 430 substantially bypasses the saturable reactor SR1 and in effect caps the energy dissipated through the saturable reactor SR1 at the knee voltage $V_{zener}$ of the zener diode Ds1. The first resetting circuit 350, therefore, provides a compromise between completely snubbing the reverse recovery current 430 of the rectifying diode D1 (i.e., allowing the first and second portion 433, 436 of the reverse recovery current 430 to flow through the saturable reactor SR1) and snubbing a substantial portion of the reverse recovery current 430, but, at the same time, reducing the thermal dissipation of the saturable reactor SR1. During this time period, the voltage across the rectifying diode D1 begins to climb (as denoted by curve portion 450 of voltage characteristic curve $V_{d1}$) and the voltage across the saturable reactor SR1 approaches zero (as denoted by curve portion 460 of voltage characteristic curve $V_{sa}$).

Turning now to time period $t_3$, the reverse recovery current 430 of the rectifying diode D1 is now substantially dissipated and the rectifying diode D1 is not conducting; the current through the rectifying diode D1 is zero (as denoted by curve portion 470 of current characteristic curve $I_{d1}$). Since no current is flowing through the rectifying diode D1, the voltage across the saturable reactor SR1 is also zero (as denoted by curve portion 480 of voltage characteristic curve $V_{sa}$). Additionally, the voltage across the rectifying diode D1 reaches its peak value and remains at that value until the next conduction cycle (as denoted by curve portion 490 of voltage characteristic curve $V_{d1}$).

As a result of the snubber circuit 310, the reverse recovery current 430 of the rectifying diode D1 is substantially dissipated and the temperature rise associated with the saturable reactor SR1 is maintained at an acceptable level. The following schematic diagrams represent the operation of the snubber circuit 310 during the previously described times of operation.

Figure 5:
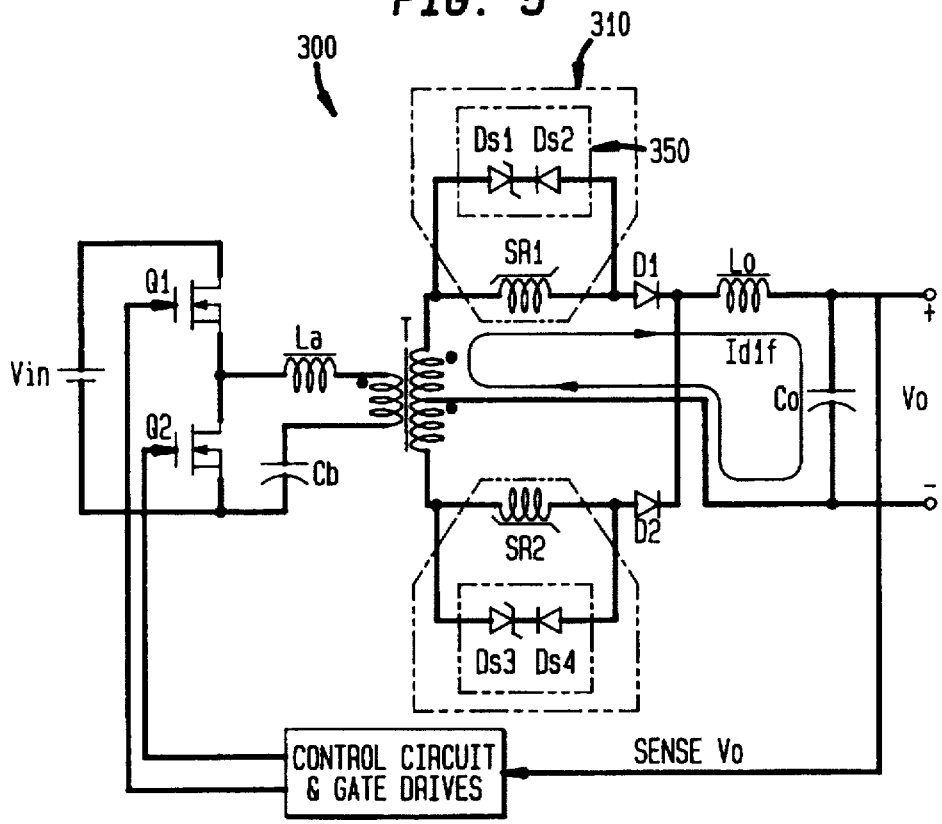
FIG. 5 illustrates a schematic diagram of the power converter employing the snubber circuits of FIG. 3 demonstrating an operation thereof.

Turning now to FIG. 5, illustrated is a schematic diagram of the power converter 300 employing the snubber circuit 310 of FIG. 3 demonstrating an operation thereof. The operation illustrated in FIG. 5 corresponds to the time $t_0$ discussed with respect to FIG. 4. The rectifying diode D1 is conducting current in a forward direction (as denoted by current path $I_{d1f}$). The current $I_{d1f}$ traverses the low pass filter $L_o$ and returns to the rectifying diode D1 crossing the saturable reactor SR1 in its path. Again, the saturable reactor SR1 is saturated thereby providing no impedance to the current $I_{d1f}$ through the rectifying diode D1. Additionally, the current $I_{d1f}$ does not traverse the first resetting circuit 350 because the blocking diode Ds2 impedes the flow of current therethrough.

Figure 6:
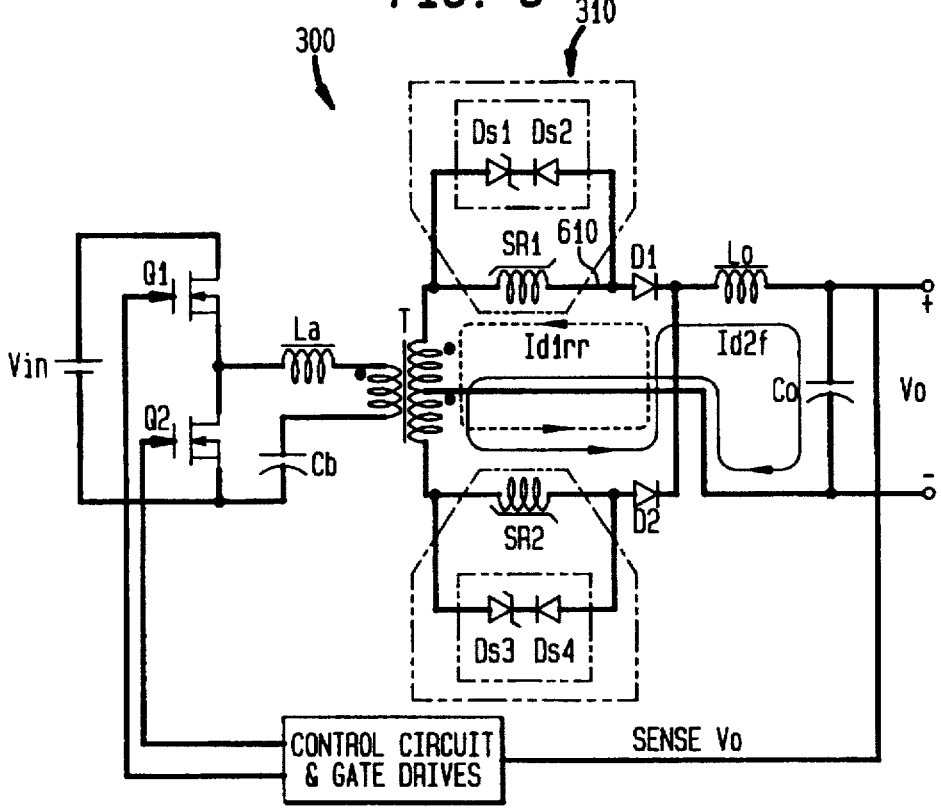
FIG. 6 illustrates a schematic diagram of the power converter employing the snubber circuits of FIG. 3 demonstrating an operation thereof.

Turning now to FIG. 6, illustrated is a schematic diagram of the power converter 300 employing the snubber circuit 310 of FIG. 3 demonstrating an operation thereof. The operation illustrated in FIG. 6 corresponds to the time $t_1$ discussed with respect to FIG. 4. At this point, the polarity of the rectifier is reversed and the rectifying diode D2 begins to conduct current (as denoted by current path $I_{d2f}$). Concurrently, the rectifying diode D1 transitions from a conducting to a non-conducting mode of operation and a first portion of the reverse recovery current (as denoted by current path $I_{d1rr}$) flows through the saturable reactor SR1 via a first conductive path 610. During the transition from conduction to non-conduction period of the rectifying diode D1 and thereafter, the core of the saturable reactor SR1 becomes non-saturated thereby providing a finite impedance to the flow of current therethrough. The saturable reactor SR1, therefore, reduces the first portion of the reverse recovery current $I_{d1rr}$ but, at the same time, dissipates thermal energy proportional to the first portion of the reverse recovery current $I_{d1rr}$ flowing therethrough.

Figure 7:
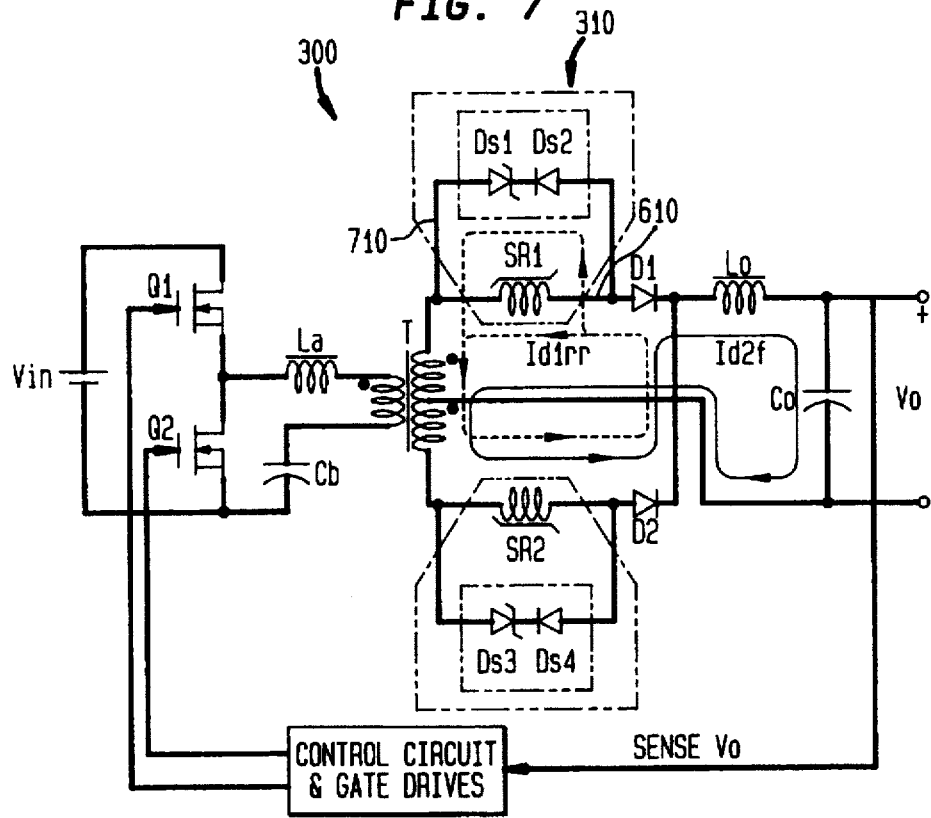
FIG. 7 illustrates a schematic diagram of the power converter employing the snubber circuits of FIG. 3 demonstrating an operation thereof.

Turning now to FIG. 7, illustrated is a schematic diagram of the power converter 300 employing the snubber circuit 310 of FIG. 3 demonstrating an operation thereof. The operation illustrated in FIG. 7 corresponds to the time $t_2$ discussed with respect to FIG. 4. Again, the polarity of the rectifier is reversed and the rectifying diode D2 continues to conduct current (as denoted by current path $I_{d2f}$). Concurrently, the rectifying diode D1 continues in the non-conducting mode of operation and a second portion of the reverse recovery current (as denoted by current path $I_{d1rr}$) flows substantially through the zener diode Ds1, via a second conductive path 710, and partially through the saturable reactor SR1, via the first conductive path 610. The voltage across the snubber circuit 310 reaches the knee voltage of the zener diode Ds1 thereby creating the second conductive path 710 for the second portion of the reverse recovery current $I_{d1rr}$. Through bypassing the saturable reactor SR1, the energy dissipated through the saturable reactor SR1 is essentially capped at the knee voltage of the zener diode Ds1.

Figure 8:
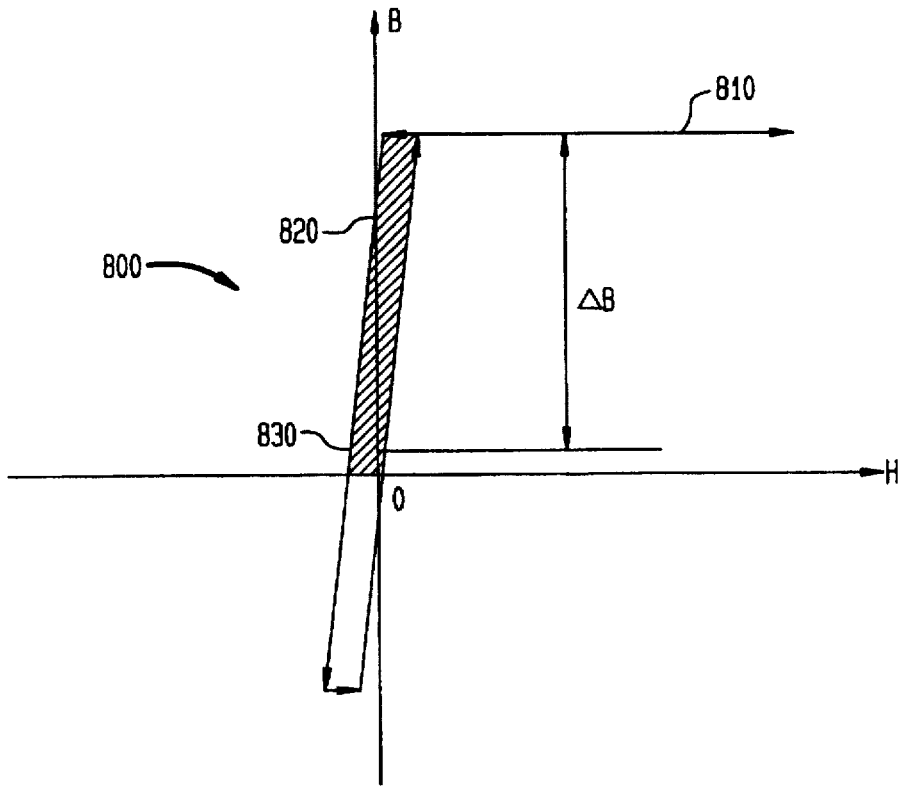
FIG. 8 illustrates a curve of magnetic flux density versus magnetic field strength for the saturable reactors of FIG. 3.

Turning now to FIG. 8, illustrated is a curve 800 of magnetic flux density ("B") versus magnetic field strength ("H") for the saturable reactors SR1, SR2 of FIG. 3. While the following discussion is directed to the first saturable reactor SR1, the principles are equally applicable to the second saturable reactor SR2 or any conventional saturable reactor employed according to the principles of the present invention.

Again, the saturable reactor, generally, constitutes a beneficial snubber circuit because of the electrical characteristics thereof. More specifically, the saturable reactor provides no impedance to the forward flow of current when the saturable core is saturated (denoted by Conversely, when the Conversely, when the saturable core is not saturated (denoted by curve portion 820), the saturable reactor provides a finite impedance to the forward flow of current therethrough. The curve portion 820 also corresponds to a change of the flux density ("ΔB") and magnetic strength ("ΔH") of the saturable core. The resulting area relating to the change in magnetic flux density and magnetic field strength is proportional to the energy dissipated by the saturable core in the form of heat generation or the like.

With continuing reference to FIG. 3, when the rectifying diode D1 is conducting, the saturable reactor SR1 is saturated (illustrated by curved portion 810) and provides no impedance to the forward flow of current. When the rectifying diode D1 transitions from a conduction to non-conduction mode of operation, a reverse recovery current results and thereby conducts through the saturable reactor SR1. At this point, the saturable reactor SR1 transitions to a non-saturated state (illustrated by curved portion 820) exhibiting an impedance to thereby reduce the first portion of the reverse recovery current. Again, the further that the saturable reactor SR1 moves away from saturation, the greater the energy dissipated by the core. Therefore, the first resetting circuit 350 provides the second conductive path for the reverse recovery current thereby substantially bypassing the saturable reactor SR1. The energy dissipated through the saturable reactor SR1 is essentially capped at a point 830 thereby representing a substantial reduction in the energy dissipated. The snubber circuit of the present invention can achieve about a 50% reduction in temperature rise, while maintaining equal snubbing performance, over prior art saturable reactor snubbing circuits. The present invention, therefore, makes saturable reactor snubber circuits very attractive for various power supply applications.

Although the present invention has been described in detail, those skilled in the art should understand that they can make various changes, substitutions and alterations herein without departing from the spirit and scope of the invention in its broadest form.

What is claimed is:

1. For use in a power supply having a rectifying diode, a snubber circuit for moderating a reverse recovery current that flows from said rectifying diode as said rectifying diode transitions from a conducting state to a non-conducting state, said snubber circuit comprising:

a saturable reactor coupled in electrical series with said rectifying diode and providing a first conductive path for a first portion of said reverse recovery current from said rectifying diode; and a saturable reactor resetting circuit, coupled in electrical parallel with said saturable reactor and providing a second conductive path for a second portion of said reverse recovery current from said rectifying diode, said second conductive path reducing said reverse recovery current through said saturable reactor, thereby decreasing a thermal dissipation of said saturable reactor as said rectifying diode transitions from said conducting state to said non-conducting state.

2. The snubber circuit as recited in claim 1 wherein said saturable reactor resetting circuit comprises a zener diode, having a reverse breakdown voltage, for conducting said second portion of said reverse recovery current from said rectifying diode, a magnitude of said second portion being a function of said reverse breakdown voltage.

3. The snubber circuit as recited in claim 1 wherein said saturable reactor resetting circuit comprises a blocking diode for biasing said second conductive path as against a flow of forward current therealong.

4. The snubber circuit as recited in claim 1 wherein said saturable reactor is operable in a saturated state when said rectifying diode is in said conducting state, said saturable reactor presenting essentially no impedance to current flow in said saturated state.

5. The snubber circuit as recited in claim 1 wherein said saturable reactor is operable in a non-saturated state when said rectifying diode is in said non-conducting state, said saturable reactor presenting a finite impedance to said reverse recovery current.

6. The snubber circuit as recited in claim 1 wherein said saturable reactor resetting circuit comprises a passive component for providing said second conductive path for said second portion of said reverse recovery current from said rectifying diode.

7. The snubber circuit as recited in claim 1 wherein said snubber circuit is employed in a power converter, a transformer forming a portion of said power converter and having first and second secondary winding taps, said snubber circuit coupled to said first secondary winding tap, a second snubber circuit coupled to said second secondary winding tap.

8. For use in a power supply having a rectifying diode, a method of moderating a reverse recovery current that flows from said rectifying diode as said rectifying diode transitions from a conducting state to a non-conducting state, said method comprising the steps of:

providing a first conductive path for a first portion of said reverse recovery current from said rectifying diode with a saturable reactor coupled in electrical series with rectifying diode; and providing a second conductive path for a second portion of said reverse recovery current from said rectifying diode with a saturable reactor resetting circuit coupled in electrical parallel with said saturable reactor, said second conductive path reducing said reverse recovery current through said saturable reactor, thereby decreasing a thermal dissipation of said saturable reactor as said rectifying diode transitions from said conducting state to said non-conducting state.

9. The method as recited in claim 8 wherein said saturable reactor resetting circuit comprises a zener diode having a reverse breakdown voltage, said step of providing said second conductive path comprising the step of conducting said second portion of said reverse recovery current from said rectifying diode, a magnitude of said second portion being a function of said reverse breakdown voltage.

10. The method as recited in claim 8 wherein said saturable reactor resetting circuit comprises a blocking diode, said step of providing said second conductive path comprising the step of biasing said second conductive path as against a flow of forward current therealong.

11. The method as recited in claim 8 further comprising the step of operating said saturable reactor in a saturated state when said rectifying diode is in said conducting state, said saturable reactor presenting essentially no impedance to current flow in said saturated state.

12. The method as recited in claim 8 further comprising the step of operating said saturable reactor in a non-saturated state when said rectifying diode is in said non-conducting state, said saturable reactor presenting a finite impedance to said reverse recovery current.

13. The method as recited in claim 8 wherein said saturable reactor resetting circuit comprises a passive component, said step of providing said second conductive path comprising the step of providing said second conductive path for said second portion of said reverse recovery current from said rectifying diode through said passive component.

14. The method as recited in claim 8 wherein said method is performed in a power converter, a transformer forming a portion of said power converter and having first and second secondary winding taps, said method comprising the steps of moderating reverse recovery currents flowing into said first and second secondary winding taps.

15. A power converter, comprising:
   control circuitry for applying control signals to a power train; and
   a power train having a power train input couplable to a source of electrical power and a power train DC output couplable to an of electrical load, said power train including:
      an isolation transformer having a primary winding and a secondary winding,
      a switch coupled to said primary winding, a rectifier, coupled to said secondary winding, having a plurality of rectifying diodes, and
      a snubber circuit for moderating reverse recovery currents that flow from said rectifier to said isolation transformer as said plurality of rectifying diodes transition from conducting states to non-conducting states, said snubber circuit comprising:
         saturable reactors, coupled between said isolation transformer and said plurality of rectifying diodes and providing first conductive paths for first portions of said reverse recovery currents from said plurality of rectifying diodes to said isolation transformer, and
         saturable reactor resetting circuits, coupled between said isolation transformer and said plurality of rectifying diodes in electrical parallel with said saturable reactors and providing second conductive paths for second portions of said reverse recovery currents from said rectifier to said isolation transformer, said second conductive paths reducing said reverse recovery currents through said saturable reactors, thereby decreasing a thermal dissipation of said saturable reactors as said plurality of rectifying diodes transition from said conducting states to said non-conducting states.

16. The power converter as recited in claim 15 wherein said saturable reactor resetting circuits comprise zener diodes, having reverse breakdown voltages, for conducting said second portions of said reverse recovery currents from said rectifier to said isolation transformer, magnitudes of said second portions being a function of said reverse breakdown voltages.

17. The power converter as recited in claim 15 wherein said saturable reactor resetting circuits comprise blocking diodes for biasing said second conductive paths as against flows of forward currents therealong.

18. The power converter as recited in claim 15 wherein said saturable reactors are operable in saturated states when corresponding rectifying diodes of said rectifier are in said conducting states, said saturable reactors presenting essentially no impedance to current flow in said saturated states.

19. The power converter as recited in claim 15 wherein said saturable reactors are operable in non-saturated states when said corresponding rectifying diodes of said rectifier are in said non-conducting states, said saturable reactors presenting finite impedances to said reverse recovery currents.

20. The power converter as recited in claim 15 wherein said saturable reactor resetting circuits comprise passive components for providing said second conductive paths for said second portions of said reverse recovery currents from said rectifier to said isolation transformer.

* * * * *